(12) United States Patent  
Sun

(10) Patent No.: US 11,854,951 B2  
(45) Date of Patent: Dec. 26, 2023

(54) SEMICONDUCTOR DEVICE

(71) Applicant: ABLIC Inc., Tokyo (JP)

(72) Inventor: Haidong Sun, Tokyo (JP)

(73) Assignee: ABLIC Inc., Tokyo (JP)

( * ) Notice: Subject to any disclaimer, the term of this patent is extended or adjusted under 35 U.S.C. 154(b) by 206 days.

(21) Appl. No.: 17/564,739

(22) Filed: Dec. 29, 2021

(65) Prior Publication Data

US 2022/0238423 A1 Jul. 28, 2022

(30) Foreign Application Priority Data

Jan. 26, 2021 (JP) ................................. 2021-010154

(51) Int. Cl.
*H01L 23/495* (2006.01)
*H03F 3/45* (2006.01)
*H01L 23/00* (2006.01)

(52) U.S. Cl.
CPC ........ *H01L 23/49575* (2013.01); *H01L 24/48* (2013.01); *H03F 3/45475* (2013.01); *H01L 2224/48247* (2013.01)

(58) Field of Classification Search
CPC ............... H01L 23/49575; H01L 24/48; H01L 2224/48247; H03F 3/45475
See application file for complete search history.

(56) References Cited

FOREIGN PATENT DOCUMENTS

JP H07-161749 A 6/1995

*Primary Examiner* — Robert G Bachner
(74) *Attorney, Agent, or Firm* — Crowell & Moring LLP

(57) ABSTRACT

Provided is a semiconductor device applicable to both types of packages regardless of whether or not double bonding of a lead frame pad is allowed. The semiconductor device includes: an operational amplifier; a feedback resistor; a reference voltage generation circuit; an output transistor; a first pad which is connected to an output terminal of the output transistor, and is to be selectively connected to a lead frame pad by a bonding wire; a second pad to be selectively connected to the lead frame pad by a bonding wire; and a connection switching element provided between the first pad and the second pad. In a case in which the second pad is connected to the lead frame pad by the bonding wire, the connection switching element interrupts connection between the first pad and the second pad.

4 Claims, 2 Drawing Sheets

SEMICONDUCTOR DEVICE

RELATED APPLICATIONS

This application claims priority to Japanese Patent Application No. 2021-010154, filed on Jan. 26, 2021, the entire content of which is incorporated herein by reference.

BACKGROUND OF THE INVENTION

1. Field of the Invention

The present invention relates to a semiconductor device.

2. Description of the Related Art

Hitherto, there has been devised a voltage regulator for suppressing an output voltage drop to be caused by a wiring resistance in a circuit or a bonding wire resistance, and supplying a highly accurate constant voltage. FIG. 4 is a circuit diagram for illustrating a configuration example of a related-art voltage regulator.

Bonding wires 4a and 4b are fixed to a lead frame pad 10 from respective pads 3a and 3b included in a semiconductor device 40. In this manner, a voltage at a feedback point can include a wiring resistance in a circuit and a bonding wire resistance.

Accordingly, the related-art voltage regulator illustrated in FIG. 4 is capable of suppressing the output voltage drop to be caused by the wiring resistance in the circuit or the bonding wire resistance, and supplying the highly accurate constant voltage (see, for example, Japanese Patent Application Laid-open No. Hei 07-161749).

In the related art, however, no consideration has been given to application to a package in which the bonding wires 4a and 4b cannot be fixed to the lead frame pad 10. That is, it has been required to prepare two types of semiconductor devices depending on whether or not double bonding of the lead frame pad of the package is allowed.

SUMMARY OF THE INVENTION

The present invention has been made in view of the above-mentioned circumstance, and has an object to provide a semiconductor device applicable to both types of packages regardless of whether or not double bonding of a lead frame pad is allowed.

According to at least one embodiment of the present invention, there is provided a semiconductor device including: an operational amplifier configured to receive a reference voltage from a reference voltage generation circuit and a feedback voltage from a feedback resistor; an output transistor to be controlled by an output signal of the operational amplifier; a first pad which is connected to an output terminal of the output transistor, and is to be selectively connected to a lead frame pad by a bonding wire; a second pad to be selectively connected to the lead frame pad by a bonding wire; a connection switching element provided between the first pad and the second pad; and the feedback resistor connected to the second pad and the connection switching element, wherein, in a case in which the second pad is connected to the lead frame pad by the bonding wire, the connection switching element interrupts connection between the first pad and the second pad.

Further, according to at least one embodiment of the present invention, there is provided a semiconductor device including: an operational amplifier configured to receive a reference voltage from a reference voltage generation circuit and a feedback voltage from a feedback resistor; an output transistor to be controlled by an output signal of the operational amplifier; a first pad connected to an output terminal of the output transistor; and a second pad connected to the feedback resistor, wherein, in a case in which any one of the first pad and the second pad is connected to a lead frame pad by a bonding wire, the first pad and the second pad are connected to each other by a bonding wire.

According to the semiconductor device of the at least one embodiment of the present invention, it is possible to provide the semiconductor device applicable to both types of packages regardless of whether or not double bonding of the lead frame pad is allowed.

DETAILED DESCRIPTION OF THE PREFERRED EMBODIMENTS

Now, embodiments of the present invention are described with reference to the drawings.

First Embodiment

Figure 1:
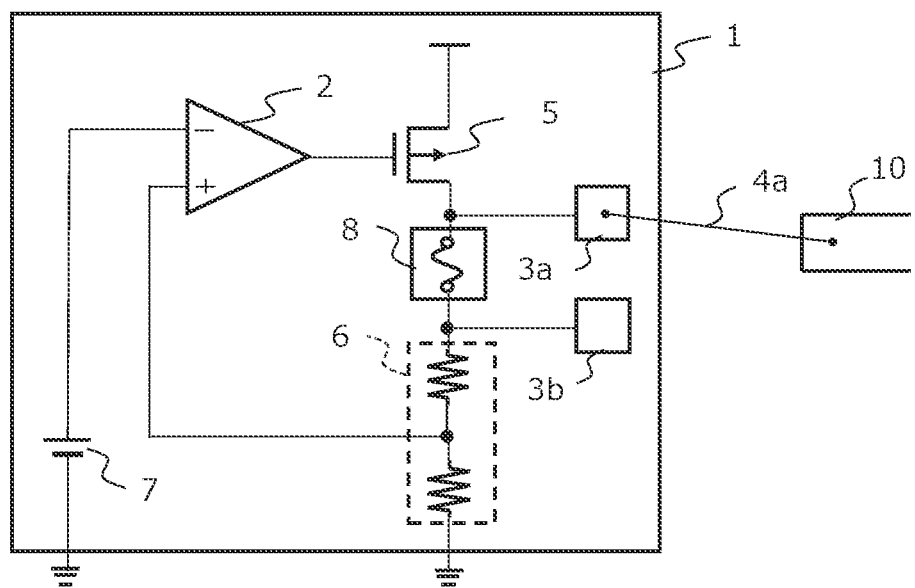
FIG. 1 is a circuit diagram for illustrating a semiconductor device according to a first embodiment of the present invention.

FIG. 1 is a circuit diagram for illustrating a semiconductor device according to a first embodiment of the present invention.

A semiconductor device 1 of FIG. 1 includes an operational amplifier 2, pads 3a and 3b, an output transistor 5, a feedback resistor 6, a reference voltage generation circuit 7, and a connection switching element 8. The connection switching element 8 is formed of a fuse. The output transistor 5 is formed of a PMOS transistor.

The operational amplifier 2 includes an inverting input terminal (−) connected to an output terminal of the reference voltage generation circuit 7, a non-inverting input terminal (+) connected to an output terminal of the feedback resistor 6, and an output terminal connected to a gate of the output transistor 5. The output transistor 5 includes a source connected to a power supply terminal, and a drain connected to one end of the connection switching element 8 and the pad 3a corresponding to an output terminal of the semiconductor device. Another end of the connection switching element 8 is connected to the pad 3b and one end of the feedback resistor 6. Another end of the feedback resistor 6 is connected to a ground terminal. Another end of the reference voltage generation circuit 7 is connected to the ground terminal.

Bonding of the semiconductor device of the first embodiment indicates a case of a package in which a lead frame pad 10 is not adapted to double bonding. That is, the lead frame pad 10 is connected to the pad 3a by a bonding wire 4a, but the lead frame pad 10 is not connected to the pad 3b.

The semiconductor device of the first embodiment is configured as follows depending on the shape of the lead frame pad 10 of the package.

In the case of the package in which the lead frame pad 10 is not adapted to double bonding, the pad 3a is connected to the lead frame pad 10 by the bonding wire 4a without cutting the fuse being the connection switching element 8.

In a case of a package in which the lead frame pad 10 is adapted to double bonding, the fuse being the connection switching element 8 is cut. Further, the pad 3a is connected to the lead frame pad 10 by the bonding wire 4a, and the pad 3b is connected to the lead frame pad 10 by a bonding wire 4b (not shown).

The semiconductor device of the first embodiment is configured as described above. In this manner, the semiconductor device of the first embodiment is applicable to both types of packages regardless of whether or not double bonding of the lead frame pad is allowed.

Figure 2:
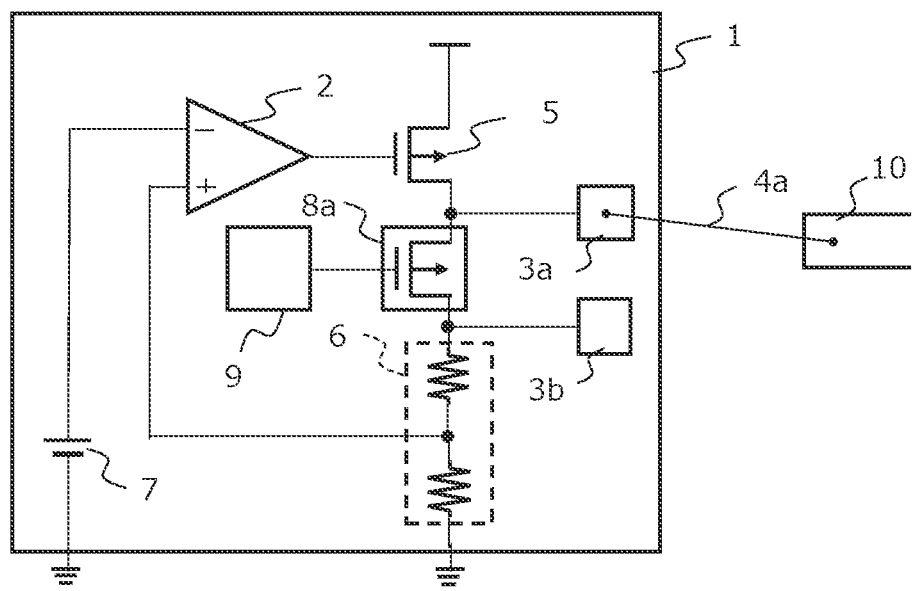
FIG. 2 is a circuit diagram for illustrating another example of the semiconductor device according to the first embodiment.

FIG. 2 is a circuit diagram for illustrating another example of the semiconductor device of the first embodiment.

The semiconductor device of FIG. 2 includes a connection switching element 8a formed of a PMOS transistor as the connection switching element, and a control circuit 9 configured to supply a control signal for controlling the connection switching element 8a. Other circuits are similar to those of the semiconductor device of FIG. 1. Thus, description thereof is omitted.

The semiconductor device of FIG. 2 can be similarly applied by turning on and off the PMOS transistor of the connection switching element 8a through use of the control signal supplied from the control circuit 9, depending on the shape of the lead frame pad 10 of the package. In this case, the connection switching element 8a is not limited to the PMOS transistor, and may be an NMOS transistor or an analog switch.

The control circuit 9 may be formed of, for example, a logic circuit or a test circuit, and may be configured to supply the control signal in response to an input signal from a test terminal or the like.

Figure 3:
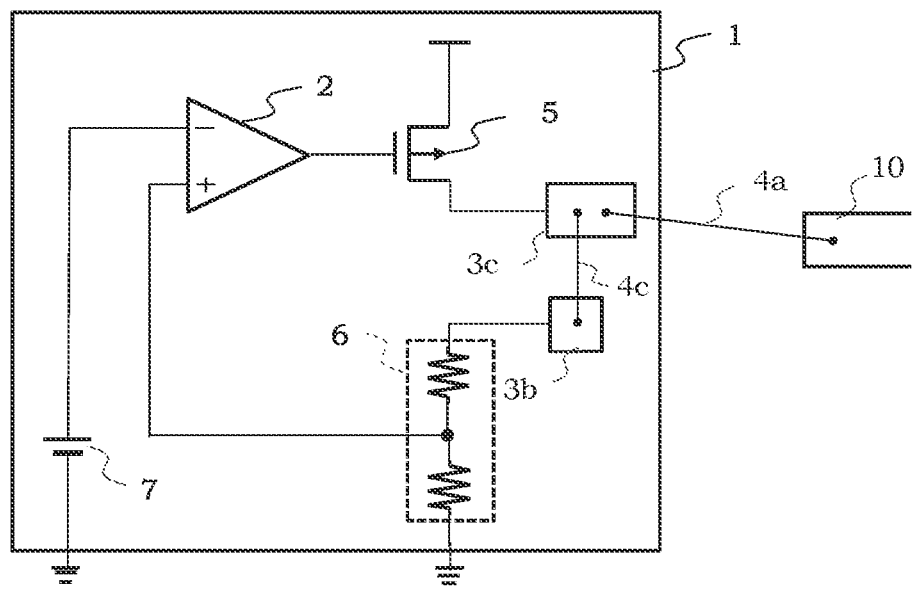
FIG. 3 is a circuit diagram for illustrating a semiconductor device according to a second embodiment of the present invention.
Figure 4:
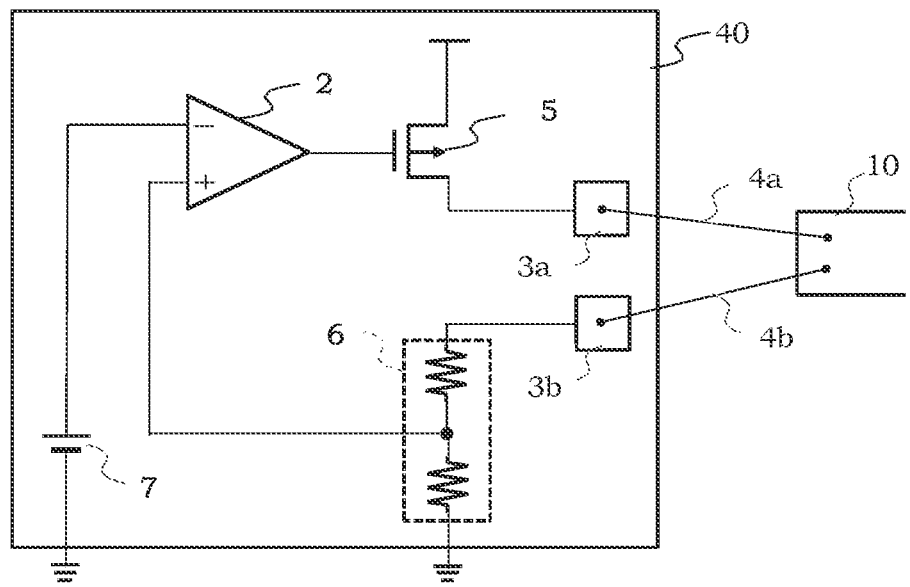
FIG. 4 is a circuit diagram for illustrating a related-art semiconductor device.

FIG. 3 is a circuit diagram for illustrating a semiconductor device according to a second embodiment of the present invention.

A semiconductor device 1 of FIG. 3 includes an operational amplifier 2, pads 3b and 3c, an output transistor 5, a feedback resistor 6, and a reference voltage generation circuit 7. The pad 3c is formed into a size adapted to double bonding.

The operational amplifier 2 includes an inverting input terminal (−) connected to an output terminal of the reference voltage generation circuit 7, a non-inverting input terminal (+) connected to an output terminal of the feedback resistor 6, and an output terminal connected to a gate of the output transistor 5. The output transistor 5 includes a source connected to a power supply terminal, and a drain connected to the pad 3c corresponding to an output terminal of the semiconductor device. The pad 3c is connected to the pad 3b by a bonding wire 4c. The pad 3b is connected to one end of the feedback resistor 6. Another end of the feedback resistor 6 is connected to a ground terminal. Another end of the reference voltage generation circuit 7 is connected to the ground terminal.

Bonding of the semiconductor device of the second embodiment indicates a case of a package in which a lead frame pad 10 is not adapted to double bonding. That is, the lead frame pad 10 is connected to the pad 3c by a bonding wire 4a, but the lead frame pad 10 is not connected to the pad 3b.

The semiconductor device of the second embodiment is configured as follows depending on the shape of the lead frame pad 10 of the package.

In the case of the package in which the lead frame pad 10 is not adapted to double bonding, the pad 3b and the pad 3c are connected to each other by the bonding wire 4c, and the pad 3c is connected to the lead frame pad 10 by the bonding wire 4a.

In a case of a package in which the lead frame pad 10 is adapted to double bonding, the pad 3b and the pad 3c are not connected to each other by the bonding wire 4c. The pad 3c is connected to the lead frame pad 10 by the bonding wire 4a, and the pad 3b is connected to the lead frame pad 10 by a bonding wire 4b (not shown).

The semiconductor device of the second embodiment is configured as described above. In this manner, the semiconductor device of the second embodiment is applicable to both types of packages regardless of whether or not double bonding of the lead frame pad is allowed.

The embodiments of the present invention have been described above, but the present invention is not limited to the above-mentioned embodiments. It should be understood that various modifications can be made thereto without departing from the gist of the present invention.

For example, in FIG. 1 and FIG. 2, the pad 3b and the lead frame pad 10 may be connected to each other by a bonding wire. Further, for example, the pad 3b of FIG. 3 may be configured similarly to the pad 3c, and may be connected to, in place of the pad 3c, the lead frame pad 10 by a bonding wire.

What is claimed is:

1. A semiconductor device, comprising:
    an operational amplifier configured to receive a reference voltage from a reference voltage generation circuit and a feedback voltage from a feedback resistor;
    an output transistor to be controlled by an output signal of the operational amplifier;
    a first pad which is connected to an output terminal of the output transistor, and is to be selectively connected to a lead frame pad by a first bonding wire;
    a second pad to be selectively connected to the lead frame pad by a second bonding wire;
    a connection switching element provided between the first pad and the second pad; and
    the feedback resistor connected to the second pad and the connection switching element,
    wherein, the connection switching element interrupts connection between the first pad and the second pad in a case that the second pad is connected to the lead frame pad by the second bonding wire.

2. The semiconductor device according to claim 1, wherein the connection switching element is a fuse.

3. The semiconductor device according to claim 1, wherein the connection switching element is a switching circuit.

4. A semiconductor device, comprising:
    an operational amplifier configured to receive a reference voltage from a reference voltage generation circuit and a feedback voltage from a feedback resistor;
    an output transistor to be controlled by an output signal of the operational amplifier;
    a first pad connected to an output terminal of the output transistor; and
    a second pad connected to the feedback resistor, wherein, a connection between the first pad and the second pad is disconnected in a case that the first pad and the second pad are connected to a lead frame pad.

* * * * *